(12) United States Patent
Ito et al.

(10) Patent No.: US 11,172,601 B2
(45) Date of Patent: Nov. 9, 2021

(54) COMPONENT MOUNTER

(71) Applicant: FUJI CORPORATION, Chiryu (JP)

(72) Inventors: Hidetoshi Ito, Okazaki (JP); Jun Iisaka, Nisshin (JP); Hidetoshi Kawai, Anjo (JP)

(73) Assignee: FUJI CORPORATION, Chiryu (JP)

( * ) Notice: Subject to any disclaimer, the term of this patent is extended or adjusted under 35 U.S.C. 154(b) by 87 days.

(21) Appl. No.: 16/497,282

(22) PCT Filed: Mar. 31, 2017

(86) PCT No.: PCT/JP2017/013686
§ 371 (c)(1),
(2) Date: Sep. 24, 2019

(87) PCT Pub. No.: WO2018/179365
PCT Pub. Date: Oct. 4, 2018

(65) Prior Publication Data
US 2020/0100407 A1 Mar. 26, 2020

(51) Int. Cl.
*H05K 13/04* (2006.01)
*H05K 13/08* (2006.01)

(52) U.S. Cl.
CPC ....... *H05K 13/0413* (2013.01); *H05K 13/041* (2018.08); *H05K 13/0452* (2013.01); *H05K 13/0812* (2018.08)

(58) Field of Classification Search
CPC ........... H05K 13/0413; H05K 13/0812; H05K 13/041; H05K 13/0452; H05K 13/0813; H05K 13/04
See application file for complete search history.

(56) References Cited

FOREIGN PATENT DOCUMENTS

| EP | 3 113 594 A1 | 1/2017 |
|---|---|---|
| JP | 11-103199 A | 4/1999 |
| JP | 2000-203713 A | 7/2000 |
| JP | 2000-277992 A | 10/2000 |
| JP | 2005-64048 A | 3/2005 |
| JP | 2008-124293 A | 5/2008 |
| JP | 2011-18817 A | 1/2011 |
| JP | 2015-23176 A | 2/2015 |
| JP | 6049029 B2 | 12/2016 |

OTHER PUBLICATIONS

International Search Report dated Jul. 4, 2017 in PCT/JP2017/013686 filed Mar. 31, 2017.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

A component mounter including a mounting head having multiple holding bodies, a revolving mechanism configured to revolve the multiple holding bodies along a revolution trajectory, a rotating mechanism configured to cause the multiple holding bodies to rotate on their axes in synchronism with each other, a detection section configured to detect a component located in one or more component detection positions which are different from the component pickup positions on the revolution trajectory from a side thereof; and a control section. The control section performs component pickup processing for causing the mounting head to cause at least one of the holding bodies located in the component pickup position to pick up and hold the component and holding body revolving processing for causing the revolving mechanism to locate the holding body that does not hold the component.

7 Claims, 8 Drawing Sheets

COMPONENT MOUNTER

TECHNICAL FIELD

The present disclosure relates to a component mounter.

BACKGROUND ART

Conventionally, there has been known a component mounter in which a component is picked up by suction force and mounted on a board. As such a component mounter, there is known a component mounter including a rotary head having multiple suction nozzles arranged thereon in such a manner as to be aligned in a circumferential direction (for example, Patent Literature 1). In the component mounter described in Patent Literature 1, a suction state of a component or the presence or absence of a component is inspected based on an image of the component picked up by the suction nozzle, the image resulting from imaging the component from a horizontal direction.

PATENT LITERATURE

Patent Literature 1: JP-A-2008-124293

BRIEF SUMMARY

Technical Problem

Incidentally, in the case of imaging a picked up component from a side thereof, there often occurs a case where the component is not oriented in a preferred direction when it is imaged, depending on the direction in which the component is picked up. For example, when a long side of a component is attempted to be imaged, a short side of the component is often imaged depending on the direction in which the component is picked up.

The present disclosure has been made in order to solve the problem described above, and a main object thereof is to image a held component more appropriately.

Solution to Problem

The present disclosure employs the following means in order to achieve the main object described above.

According to the present disclosure, there is provided a component mounter including:

a mounting head which has a rotating body and multiple holding bodies arranged along a circumferential direction of the rotating body and is configured to hold a component, the multiple holding bodies revolving along a revolution trajectory caused by rotation of the rotating body, one or more component pickup positions, where the holding bodies pick up a component, residing on the revolution trajectory;

a revolving mechanism configured to revolve the multiple holding bodies by rotating the rotating body;

a rotating mechanism configured to cause the multiple holding bodies to rotate respectively in synchronism with each other;

a detection section configured to detect a component from a side thereof, the component being held by the holding body that is located in one or more component detection positions which are different from the component pickup positions on the revolution trajectory, and a control section configured to perform component pickup processing and holding body revolving processing alternately and repeatedly, the component pickup processing causing the mounting head to enable at least one of the holding bodies, being located in the component pickup position, to pick up and hold the component, the holding body revolving processing causing the revolving mechanism to locate, in the position of the holding body that picks up the component during the component pickup processing, a holding body without holding the component, the control section further executing the holding body revolving processing, in an event of performing holding body rotating processing, which causes the rotating mechanism to change a component holding angle of a component to a detection angle that differs from the component holding angle of the component when the component is picked up, the component being held to at least one of the holding bodies located in the component detection position through a current holding body revolving processing, the component holding angle representing an orientation of the component based on a radial direction of the revolution trajectory.

The component mounter alternately and repeatedly performs the component pickup processing for causing the holding body to pick up the component in the component pickup position and the holding body revolving processing for locating the holding body that does not hold the component in the component pickup position, eventually allowing the multiple holding bodies to pick up and hold a component. Then, when performing the holding body revolving processing, the component mounter performs the holding body rotating processing for causing the multiple holding bodies to rotate on their axes so that the component holding angle of the component held to the holding body that is located in the component detection position through the current holding body revolving processing is changed to the detection angle that differs from the component holding angle of the component when the component is picked up. Due to this, the component picked up by the holding body in the component pickup position moves while being revolved and rotating on its axis through the holding body revolving processing and the holding body rotating processing and is eventually located in the component detection position by the orientation of the component being adjusted so that the component holding angle is changed to the detection angle. As a result, in case the detection angle is determined in advance so as to be an angle suitable for detection of the component, the held component can be detected more appropriately by the detection section.

DESCRIPTION OF EMBODIMENT

Figure 1:
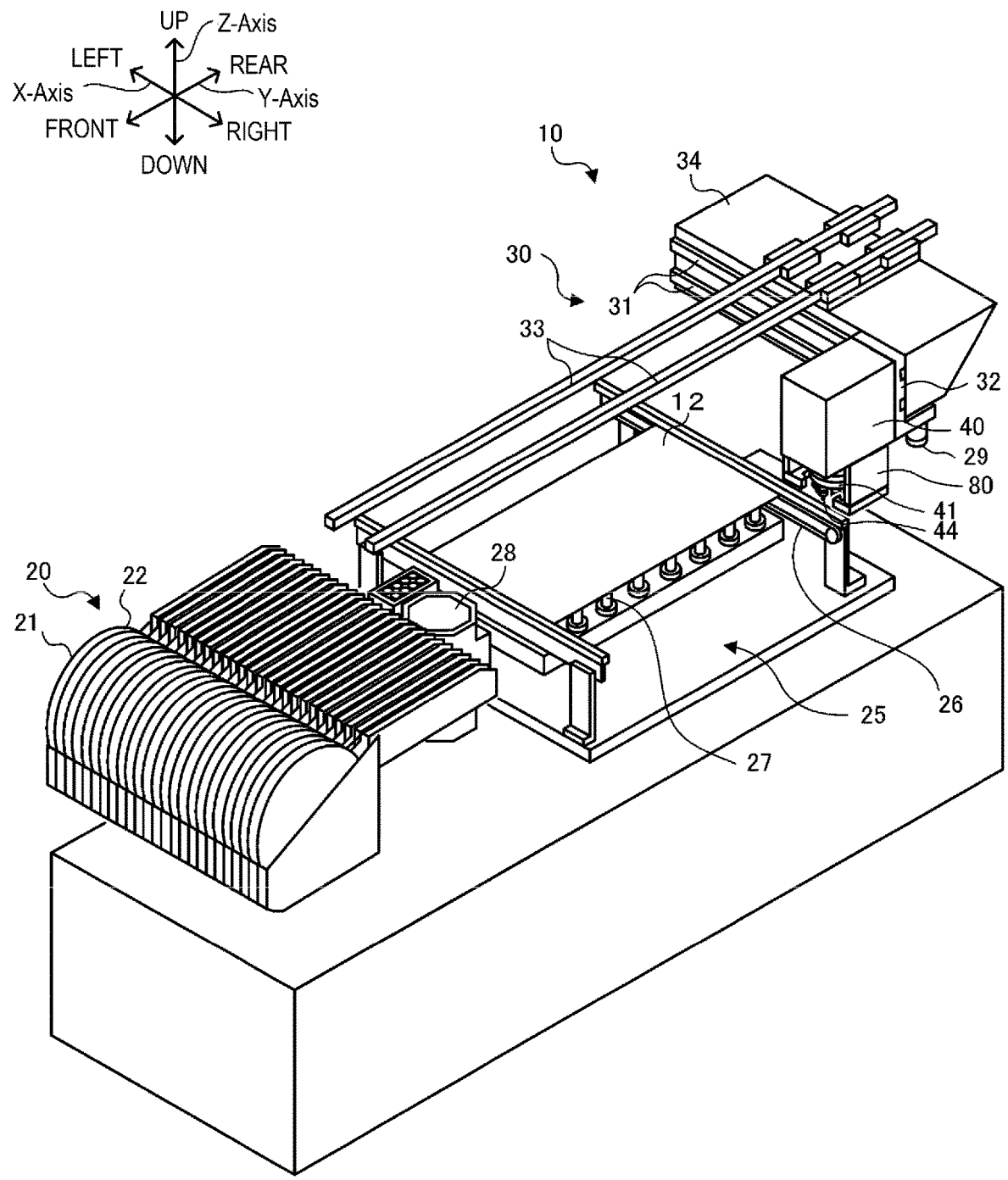
FIG. 1 is a perspective view showing a schematic configuration of component mounter 10.
Figure 2:
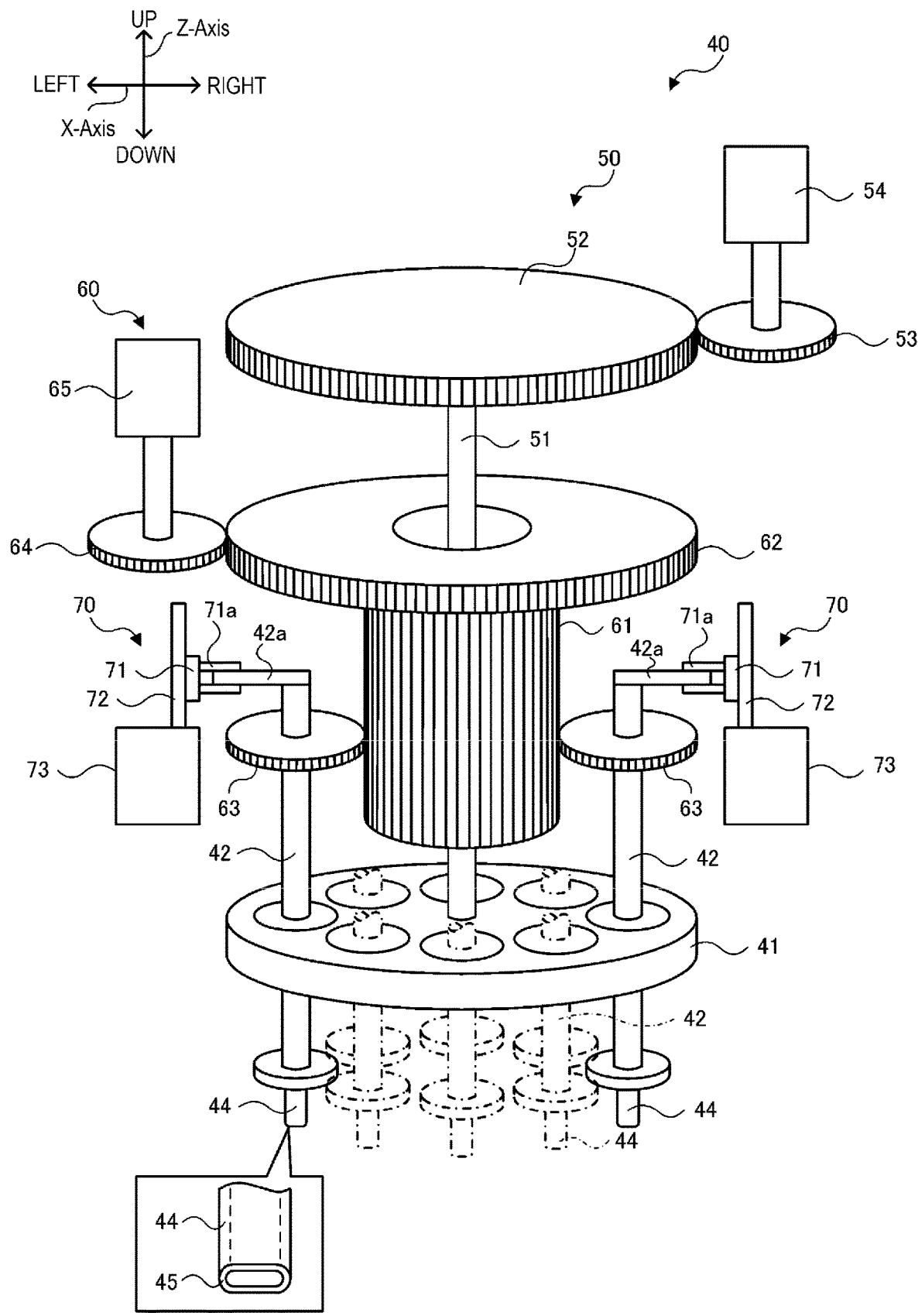
FIG. 2 is an explanatory diagram showing a schematic configuration of mounting head 40.
Figure 3:
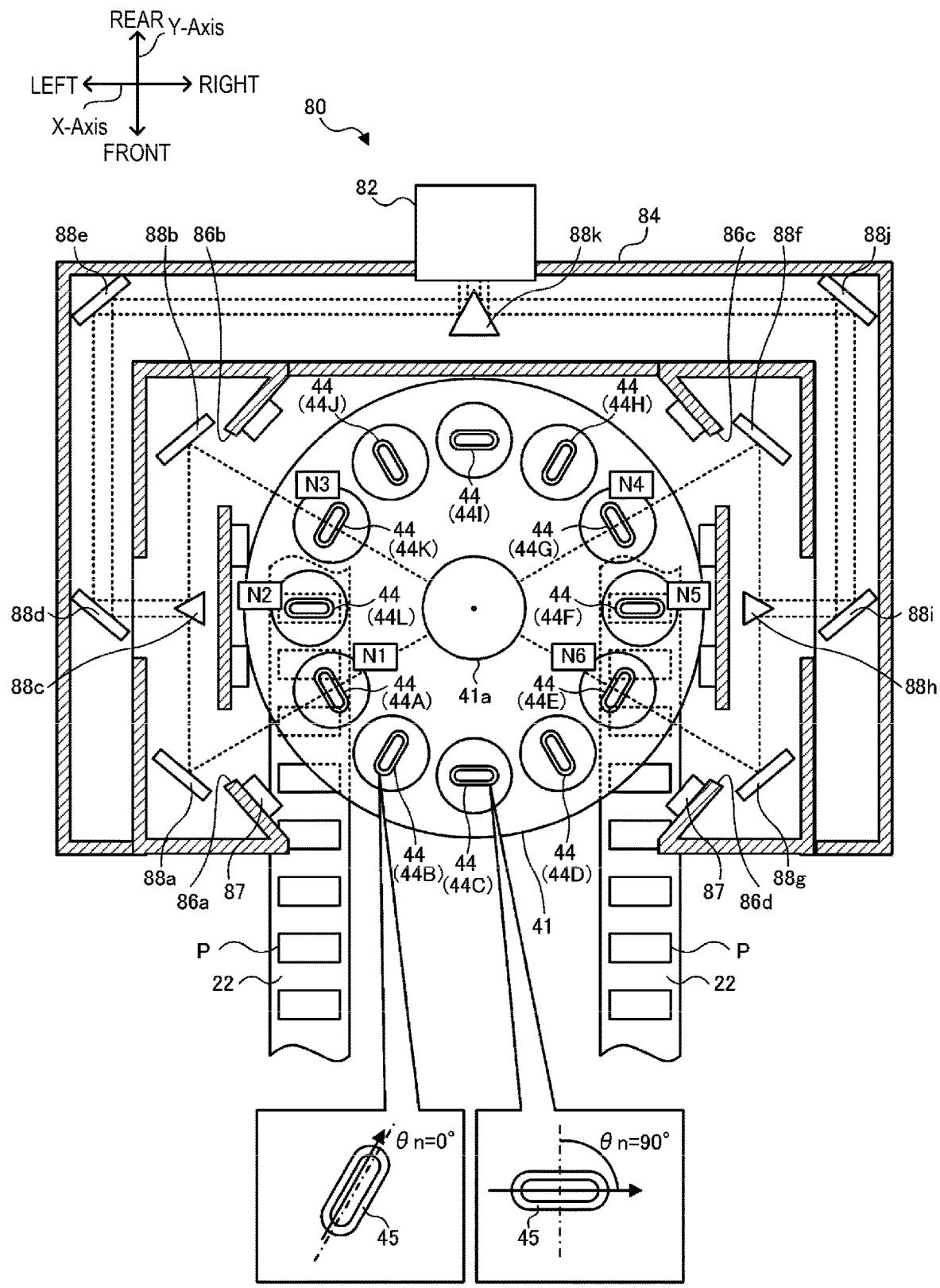
FIG. 3 is a plan view showing an arrangement of nozzles 44 and a schematic configuration of side camera 80.
Figure 4:
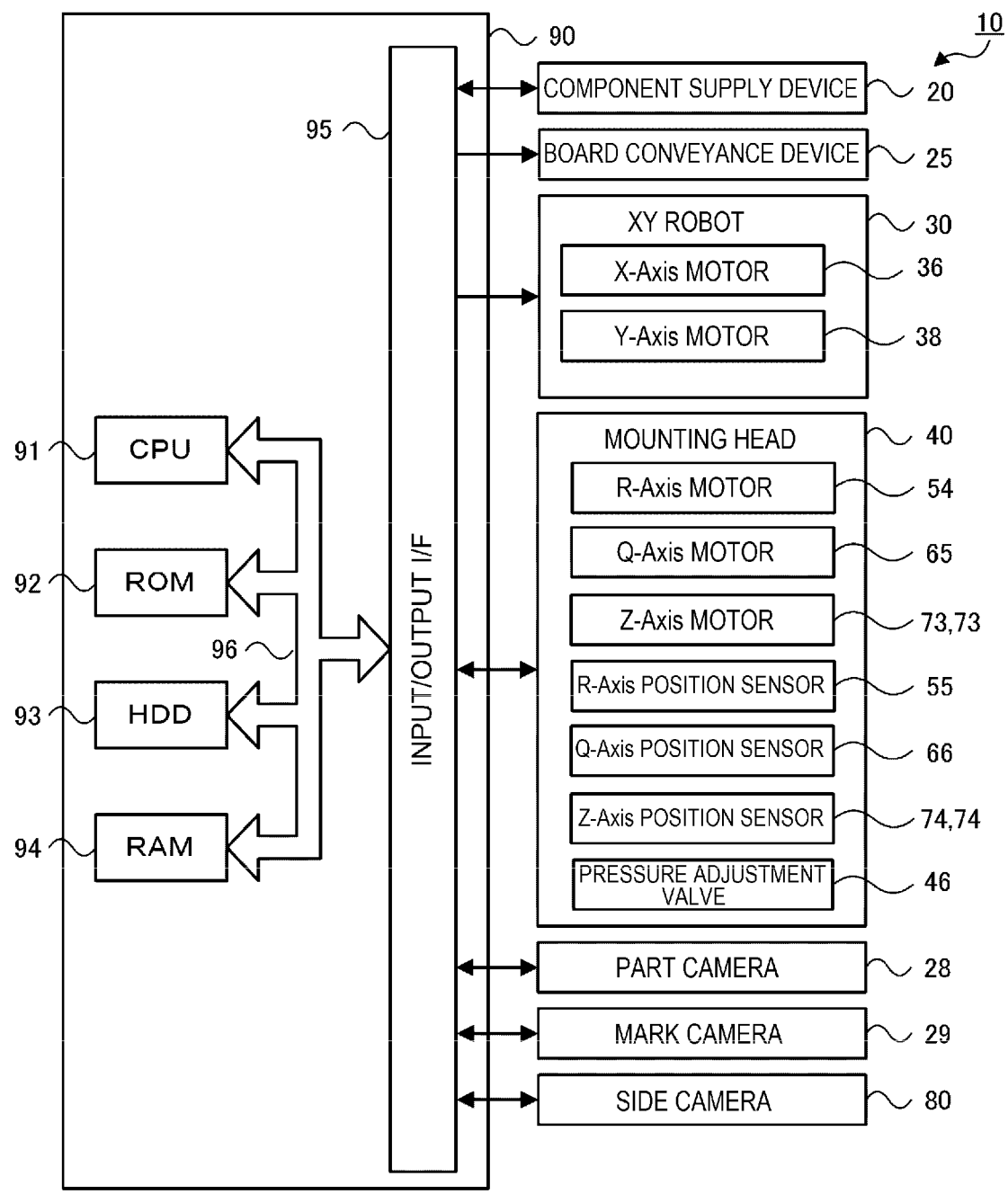
FIG. 4 is an explanatory diagram showing an electrical connection relationship of control device 90.

Hereinafter, an embodiment of the present disclosure will be described by reference to drawings. FIG. 1 is a perspective view showing a schematic configuration of component mounter 10, FIG. 2 is an explanatory diagram showing a schematic configuration of mounting head 40, FIG. 3 is a plan view showing an arrangement of nozzles 44 and a schematic configuration of side camera 80, and FIG. 4 is an explanatory diagram showing an electrical connection relationship of control device 90. Note that in FIG. 1, a left-right direction denotes an X-axis direction, a front (near side)-rear (far side) direction denotes a Y-axis direction, and an up-down direction denotes a Z-axis direction.

As shown in FIG. 1, component mounter 10 includes component supply device 20, board conveyance device 25, XY robot 30, mounting head 40, part camera 28, mark camera 29, side camera 80, and control device 90 (refer to FIG. 4).

As to supply device 20, multiple supply devices 20 are provided in such a manner as to be aligned side by side in the left-right direction (the X-axis direction) at a front side of component mounting device 10. This component supply device 20 is configured as a tape feeder for pulling out tape 22 (refer to FIG. 3) installing thereon components P that are disposed at predetermined intervals from a reel 21 to feed the tape at a predetermined pitch. Components installed on tape 22 are protected by a film covering a surface of tape 22. When component P arrives at a predetermined component supply position, the film is peeled off to expose component P in question. In the present embodiment, component P is described as being component P of a rectangular parallelepiped shape having a substantially rectangular upper surface as shown in a plan view of FIG. 3. Component P has a longitudinal direction and a lateral direction when seen from above and is installed on tape 22 in such a manner that the longitudinal direction extends along the left-right direction.

Board conveyance device 25 includes, as shown in FIG. 1, a pair of conveyor belts 26. 26 (only one of them is shown in FIG. 1) provided in such a manner as to be spaced apart from each other in a front-rear direction while extending in the left-right direction. When board 12 is conveyed by conveyor belts 26, 26 to arrive at a predetermined capture position, board 12 is supported by multiple support pints 27 erected to face a rear side board 12.

As shown in FIG. 1, XY robot 30 includes pair of left and right Y-axis guide rails 33, 33 provided along the front-rear direction (Y-axis direction) and a Y-axis slider 34 spanning pair of left and right Y-axis guide rails 33, 33. XY robot 30 includes X-axis guide rails 31, 31 provided on a front surface of Y-axis slider 34 along the left-right direction (X-axis direction) and X-axis slider 32 attached to X-axis guide rails 31 and 31. X-axis slider 32 is movable in the X-axis direction by being driven by X-axis motor 36 (refer to FIG. 4), and Y-axis slider 34 is movable in the Y-axis direction by being driven by Y-axis motor 38 (refer to FIG. 4). Mounting head 40, mark camera 29, and side camera 80 are attached to X-axis slider 32. Mounting head 40, mark camera 29, and side camera 80 are moved to any position on an XY-plane as a result of movement of XY robot 30.

As shown in FIG. 2, mounting head 40 includes head main body 41, nozzle holders 42, and nozzles 44. Head main body 41 is a disk-like rotating body. Cylindrical reflective body 41a configured to reflect light is attached to a center of a lower surface of head main body 41 (refer to FIG. 3). Multiple nozzle holders 42 are provided at predetermined intervals in a circumferential direction of head main body 41, whereby mounting head 40 is configured as a rotary head. Nozzles 44 are attached to distal end portions of nozzle holders 42 in a replaceable fashion. Nozzles 44 are attached to head main body 41 via nozzle holders 42, and are disposed along the circumferential direction of head main body 41. In FIG. 2, for the sake of easy viewing of nozzle holders 42, reflective body 41a is omitted from illustration, and eight nozzle holders 42 and eight nozzles 44 are shown, but in the present embodiment, the number of nozzles 44 is 12 as shown in FIG. 3. Therefore, the number of the nozzle holders 42 is also 12. As shown in FIG. 3, 12 nozzles 44 are sequentially referred to as nozzles 44A to 44L counterclockwise from nozzle 44 at the 8 o'clock position in the figure. Mounting head 40 includes R-axis driving device 50, Q-axis driving device 60, and Z-axis driving devices 70, 70. In FIG. 2, as a matter of convenience in description, two nozzle holders 42 located in positions where they come into engagement with Z-axis driving devices 70, 70 are shown by solid lines, and other nozzle holders 42 are shown by alternate long and short dash lines.

R-axis driving device 50 is a mechanism for revolving multiple nozzles 44 by rotating head main body 41. This R-axis driving device 50 includes R shaft 51, R-axis motor 54, and R-axis position sensor 55 (refer to FIG. 4). R shaft 51 extends in the up-down direction, and its lower end is attached to a central shaft of head main body 41. R-axis motor 54 rotationally drives gear 53 in mesh engagement with R-axis gear 52 provided at an upper end of R shaft 51. R-axis position sensor 55 detects a rotational position of R-axis motor 54. In R-axis driving device 50, R shaft 51 is rotationally driven by R-axis motor 54 via gear 53 and R-axis gear 52, whereby head main body 41 is caused to rotate. As head body 41 rotates, multiple nozzle holders 42 and multiple nozzles 44 revolve in the circumferential direction together with head main body 41. That is, when R-axis driving device 50 is driven, multiple nozzles 44 revolve along a revolution trajectory centered at a rotation axis of head main body 41. R-axis driving device 50 can intermittently revolve nozzles 44 by a predetermined angle by intermittently rotating head main body 41 by a predetermined angle (for example, 30 degrees).

Here, on the revolution trajectory of nozzles 44, one or more component pickup positions exist where nozzles 44 pick up component P from component supply device 20. In the present embodiment, two nozzle positions N2, N5 shown in FIG. 3 constitute such component pickup positions, and when arriving at these component pickup positions, nozzles 44 pick up component P. Nozzle positions N2 and N5 are located in positions facing laterally diametrically each other across a center axis of the revolution trajectory of nozzles 44. Nozzle position N2 is a position at a left end on the revolution trajectory of nozzles 44 (a 9 o'clock position in FIG. 3), and nozzle position N5 is a position at a right end of the revolution trajectory of nozzles 44 (a 3 o'clock position in FIG. 3). In FIG. 3, nozzle 44L is located in nozzle position N2, and nozzle 44F is located in nozzle position N5. On the revolution trajectory, one or more component mounting positions also exist for mounting (mounting) component P held to nozzle 44 on board 12. Component mounting positions are located in nozzle positions N2, N5, as with the component pickup positions. With nozzle 44 located in nozzle position N2 on the revolution trajectory of nozzles 44, a position where nozzle 44 (nozzle 44A in FIG. 3) directly ahead of nozzle 44 in nozzle position N2 is located is referred to as nozzle position N1, and a position where nozzle 44 (nozzle 44K in FIG. 3) directly behind nozzle 44 in nozzle position N2 is located is referred to as nozzle position N3. Similarly, a position where nozzle 44 (nozzle 44G in FIG. 3) directly ahead of nozzle 44 (nozzle 44F in FIG. 3) in nozzle position N5 is located is referred to as nozzle position N4, and a position where nozzle 44 (nozzle 44E in FIG. 3) directly behind nozzle 44 in nozzle position N5 is located is referred to as nozzle position N6. Nozzle positions N1, N3, N4, N6 are positions where side camera 80 images at least one of nozzle 44 and component P held by nozzle 44 and hence are also referred to as imaging positions. In the imaging positions, nozzle positions N1, N4 are position where side camera 80 images states of nozzles 44 before they pick up component P and are also referred to as pre-pickup imaging positions. In addition, in the imaging positions, nozzle positions N3, N6 are positions where side camera 80 images component P picked up and held to nozzle 44 and are also referred to as post-pickup imaging positions. The imaging positions are positions that differ from the component pickup positions. The component imaging position is an example of a component detection position.

Q-axis driving device 60 is a mechanism for causing multiple nozzles 44 to rotate (on their axes) synchronously. Q-axis driving device 60 includes two upper and lower Q-axis gears 61, 62, gears 63, 64, Q-axis motor 65, and Q-axis position sensor 66 (refer to FIG. 4). Two upper and lower Q-axis gears 61, 62 are placed on and concentrically with R shaft 51 in such a manner as to rotate relatively. Gears 63 are provided at upper portions on nozzle holders 42 and are in mesh engagement with lower Q-axis gear 61 in such a manner as to slide in the up-down direction. Q-axis motor 65 rotationally drives gear 64 meshing with upper Q-axis gear 62. Q-axis position sensor 66 detects a rotational position of Q-axis motor 65. Q-axis driving device 60 rotationally drives Q-axis gears 61, 62 by Q-axis motor 65, thereby rotating gears 63 meshing with Q-axis gear 61 and rotating corresponding nozzle holders 42 on their axes in the same direction and by the same rotation amount (rotation angle). Accordingly, multiple nozzles 44 also rotate in synchronism with each other.

Z-axis driving devices 70, 70 are provided at two locations on a turning (revolution) trajectory of nozzle holders 42 and lifts up and lowers nozzle holders 42 individually at the two locations. In the present embodiment, Z-axis driving devices 70, 70 are provided in such a manner as to face each other diametrically laterally across the center of head main body 41. A position where nozzle holder 42 can be lifted up and lowered by Z-axis driving device 70 is referred to as a lifting and lowering position. The lifting and lowering position is the same position as the component pickup position of nozzle 44 when seen from above. Z-axis driving device 70 includes Z-axis slider 71, Z-axis motor 73, and Z-axis position sensor 74 (refer to FIG. 4). Z-axis slider 71 is attached to a ball screw 72 extending in the up-down direction in such a manner as to be lifted up and lowered. Z-axis slider 71 includes gripping section 71a configured to grip on engagement piece 42a extending laterally from nozzle holder 42. Z-axis motor 73 lifts up and lowers Z-axis slider 71 by rotating ball screw 72. Z-axis position sensor 74 detects a position of Z-axis slider 71 in the up-down direction. Z-axis driving device 70 drives Z-axis motor 73 to lift up and lower Z-axis slider 71 along ball screw 72, thereby lifting up and lowering nozzle holder 42 integrated with Z-axis slider 71 and corresponding nozzle 44. When nozzle holder 42 revolves together with head main body 41 and stops in the lifting up and lowering position where Z-axis driving device 70 is disposed, engagement piece 42a of nozzle holder 42 in question is gripped by gripping section 71a of Z-axis slider 71. As a result, Z-axis driving device 70 lifts up and lowers nozzle holder 42 in the lifting up and lowering position and nozzle 44 in the component pickup position. As a result, at the time of picking up a component, nozzle 44 positioned in the component pickup position is lowered to pick up component P of component supply device 20. In addition, at the time of mounting a component, nozzle 44 located in the component mounting position is lowered to mount component P held to nozzle 44 on board 12. When nozzle holder 42 is caused to revolve and moves away from the lifting and lowering position, engagement piece 42a of nozzle holder 42 comes out of gripping section 71a of Z-axis slider 71.

Nozzle 44 is a member for picking up component P from component supply device 20 and holding component P so picked up. Nozzle 44 sucks and holds component P when a negative pressure is supplied thereto via pressure adjustment valve 46 (refer to FIG. 4) and releases component P in question when the atmospheric pressure or a positive pressure is supplied thereto. As shown in FIGS. 2, 3, each of multiple nozzles 44 has at a lower end thereof end surface 45 configured to be brought into contact with component P when holding component P in question. End surface 45 has a shape having a longitudinal direction and a lateral direction when seen from a bottom thereof. More specifically, end surface 45 has a rectangular shape with rounded corners when viewed from the bottom thereof. The shape of end surface 45 may be elliptical in a bottom view. A shape of a suction port at a center of end surface 45 has a longitudinal direction and a lateral direction in a bottom view similarly to an external shape of end surface 45. In the present embodiment, the suction port has a rectangular shape with rounded corners when viewed from the bottom as with end surface 45. Note that the shape of the suction port does not have to have the longitudinal direction and the lateral direction and may be, for example, circular. End surface 45 of nozzle 44 has a shape having a longitudinal direction and a lateral direction, and this shape of end surface 45 is suitable for holding component P having the shape similarly having the longitudinal direction and the lateral direction.

Each of multiple nozzles 44 is attached to corresponding nozzle holder 42 in such a manner that with an orientation of end surface 45 with respect to a radial direction of the revolution trajectory of nozzle 44 referred to as a nozzle angle, nozzle angles of adjacent nozzles 44 differ by 90 degrees. In the present embodiment, a direction along the longitudinal direction of end surface 45 is defined as the orientation of nozzle 44, and an angle formed by this direction and the radial direction of the revolution trajectory is defined as nozzle angle $\theta n$. For example, in a state shown in FIG. 3, as shown in a lower enlarged view, since the orientation of nozzle 44B (a direction indicated by an arrow) and the radial direction of the revolution trajectory (a direction indicated by an alternate long and short dash line) are parallel to each other, nozzle angle $\theta n$ of nozzle 44B is 0°. On the other hand, since an orientation of nozzle 44C lying adjacent to nozzle 44B is orthogonal to the radial direction of the revolution trajectory, nozzle angle $\theta n$ of nozzle 44C is 90°. With nozzle angle $\theta n$, when viewed from above, a direction turning clockwise from the radial direction of the revolution trajectory is referred as positive. As can be seen from FIG. 3, as with nozzle 44B, nozzles 44D, 44F, 44H, 44J, and 44L have nozzle angle θn which is 0°. Additionally, as with nozzle 44C, nozzles 44A, 44E, 44G, 44I, and 44K have nozzle angle θn which is 90°. The reason that nozzle 44 is attached to head main body 41 while being oriented as described above will be described later. In addition, in disposing adjacent nozzles 44 in such a manner that their nozzle angles θn differ in the way described above, in the case where the orientation of nozzle 44 in which nozzle 44 can be attached to nozzle holder 42 is determined, orientations in which adjacent nozzle holders 42 are attached to head main body 41 need only be changed. In the present embodiment, the orientation of nozzle 44 is defined as the direction following the longitudinal direction of end surface 45, but the orientation of nozzle 44 can be determined arbitrarily. For example, with the lateral direction of end surface 45 referred to as the orientation of nozzle 44, the value of nozzle angle θn may be defined. Further, in the present embodiment, since end surface 45 is of 2-fold symmetry, for example, nozzle angle θn=90° and nozzle angle θn=−90° are synonymous, and they do not have to be distinguished from each other.

As shown in FIG. 1, part camera 28 is provided between component supply devices 20 and board conveyance device 25. Part camera 28 images a posture of component P picked up by and held to nozzle 44 from below.

Mark camera 29 is provided on a lower surface of X-axis slider 32. Mark camera 29 images a reference mark applied to component supply device 20 or images a reference mark provided on board 12. Control device 90 specifies positions of components P installed on tape 22 or specifies a position of board 12 based on the positions of the reference marks in captured images.

Side camera 80 is a device configured to image an object located in one or more imaging positions (here, nozzle positions N1, N3, N4, N6) including one or more component imaging positions (here, nozzle positions N3, N6) from a side thereof. Side camera 80 images at least one of nozzle 44 located in the imaging position and component P held to nozzle 44 in question. Side camera 80 images component P held to nozzle 44 located in the component imaging position. As shown in FIG. 3, side camera 80 includes camera main body 82 provided behind nozzle 44, and housing 84 having an optical system unit that forms an optical path to camera main body 82. Housing 84 is disposed in such a manner as to surround the right and left, and the rear of multiple nozzles 44. First to fourth entrance ports 86a to 86d are formed in housing 84 in left front, left rear, right rear and right front positions of head main body 41. First to fourth entrance ports 86a to 86d face nozzle positions N1, N3, N4, N6, respectively, in a one-to-one fashion. Additionally, multiple illuminants 87, which are LEDs emitting light towards reflective body 41a attached to head main body 41, are provided on an outer circumferential surface of housing 84 that faces multiple nozzles 44 (four on each of the left and right of head main body 41 in FIG. 3). Housing 84 includes multiple mirrors 88a to 88k configured to reflect light in an interior thereof. Incidentally, housing 84 may include another optical system such as a prism configured to refract light instead of one or more of mirrors 88a to 88k or in addition to mirrors 88a to 88k. Mirrors 88a to 88e are disposed at a left side of housing 84 to form an optical path indicated by broken lines in the figure and guide light entering from first and second entrance ports 86a and 86b to mirror 88k disposed directly ahead of camera main body 82. For example, light entering from first entrance port 86a is reflected sequentially by mirrors 88a, 88b, 88d, and 88e in this order and arrives at mirror 88k. Mirrors 88f to 88j are disposed at a right side of housing 84 to form an optical path indicated by broken lines in the figure and guide light entering from third and fourth entrance ports 86c and 86d to mirror 88k. Mirror 88k reflects light arriving from first to fourth entrance ports 86a to 86d and guides the light to camera main body 82.

As a result, camera main body 82 images objects located in nozzle positions N1, N3, N4, and N6 and acquires image data representing one image in which obtained images are arranged in the left-right direction in the image. Therefore, camera main body 82 can simultaneously image nozzles 44 and component P located in nozzle positions N1, N3, N4, and N6 from sides thereof. The arrangement and shapes of first to fourth entrance ports 86a to 86d and mirrors 88a to 88k are adjusted so that the directions in which camera main body 82 images the individual imaging positions become directions following the radial direction of the revolution trajectory of nozzles 44, that is, directions toward the center of the revolution trajectory of nozzles 44. Camera main body 82 receives light emitted from illuminants 87 and reflected by reflective body 41a. Therefore, in the resulting image, nozzles 44 and components P that block light are displayed as black shadows.

As shown in FIG. 4, control device 90 is configured as a microprocessor made up mainly of CPU91 and includes ROM92, HDD93, RAM94, input/output interface 95, and the like in addition to CPU91. These are connected with one another via bus 96. A detection signal from XY robot 30, a detection signal from mounting head 40 (R-axis position sensor 55, Q-axis position sensor 66, Z-axis position sensors 74, 74), an image signal from part camera 28, an image signal from mark camera 29, an image signal from side camera 80, and the like are inputted into control device 90 via input/output interface 95. Control device 90 outputs control signals and the like to component supply device 20, board conveyance device 25, XY robot 30 (X-axis motor 36 and Y-axis motor 38), mounting head 40 (R-axis motor 54, Q-axis motor 65, and Z-axis motors 73, 73), pressure adjustment valve 46, part camera 28, mark camera 29, and side camera 80 via input/output interface 95.

Next, the operation of component mounter 10 when it performs a component mounting process will be described. CPU91 of control device 90 controls the sections of component mounter 10 based on the production program received from a management device (not shown) to produce boards 12 on which multiple components are mounted. Specifically, CPU 91 controls the sections of component mounter 10, causing nozzles 44 to pick up and hold components P supplied from component supply devices 20 and mount components P held to nozzles 44 sequentially on board 12.

Figure 5:
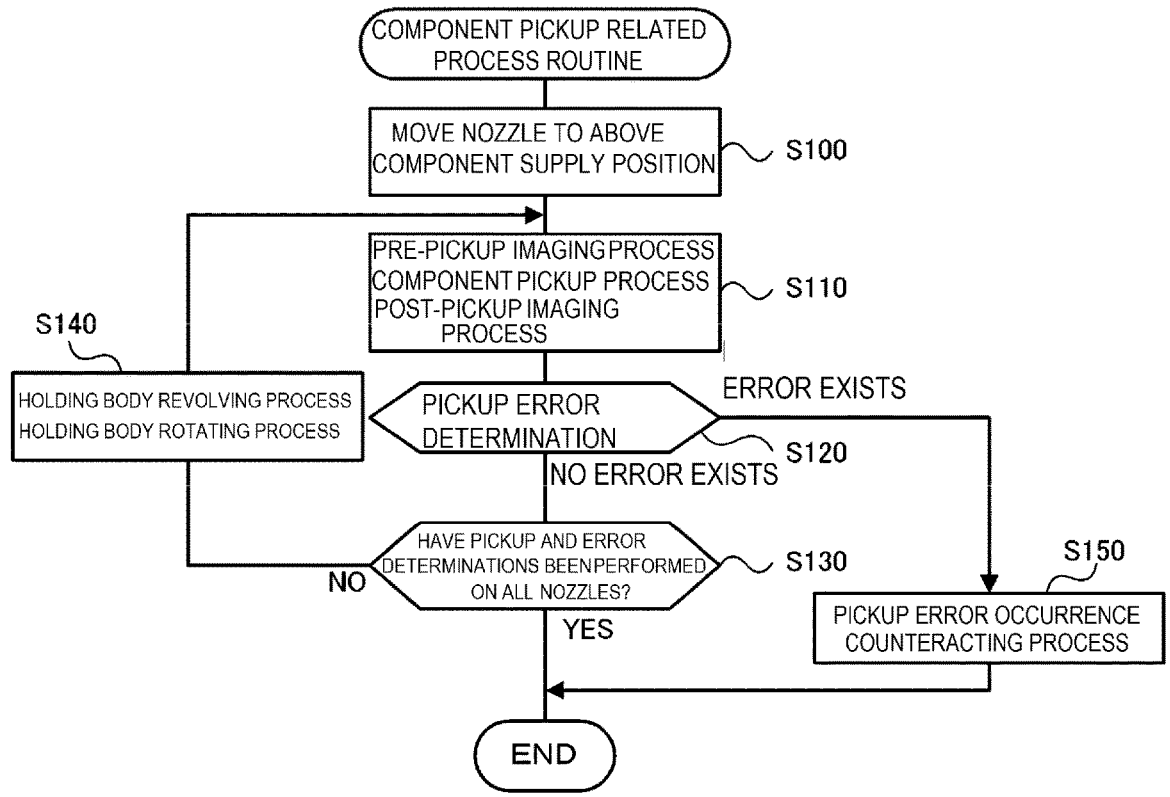
FIG. 5 is a flowchart showing an example of a component pickup-related processing routine.
Figure 6:
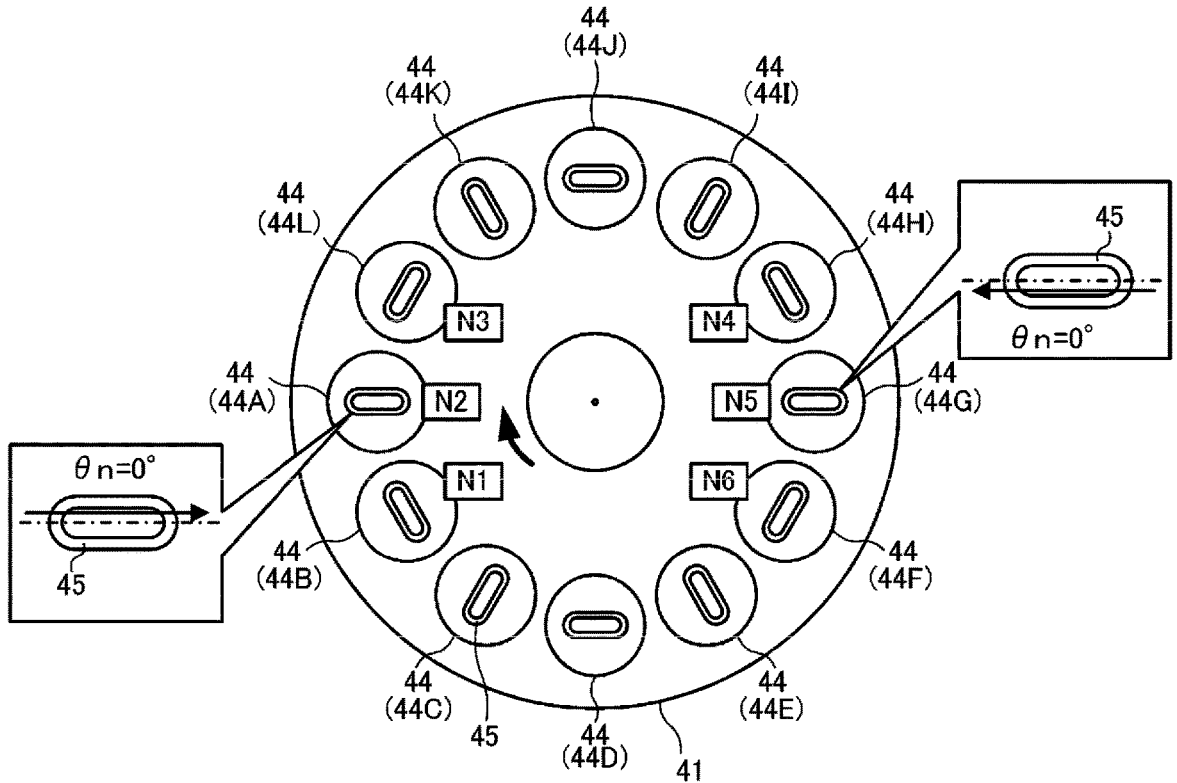
FIG. 6 is an explanatory diagram showing how nozzles 44A, 44G are positioned in component pickup positions.
Figure 7:
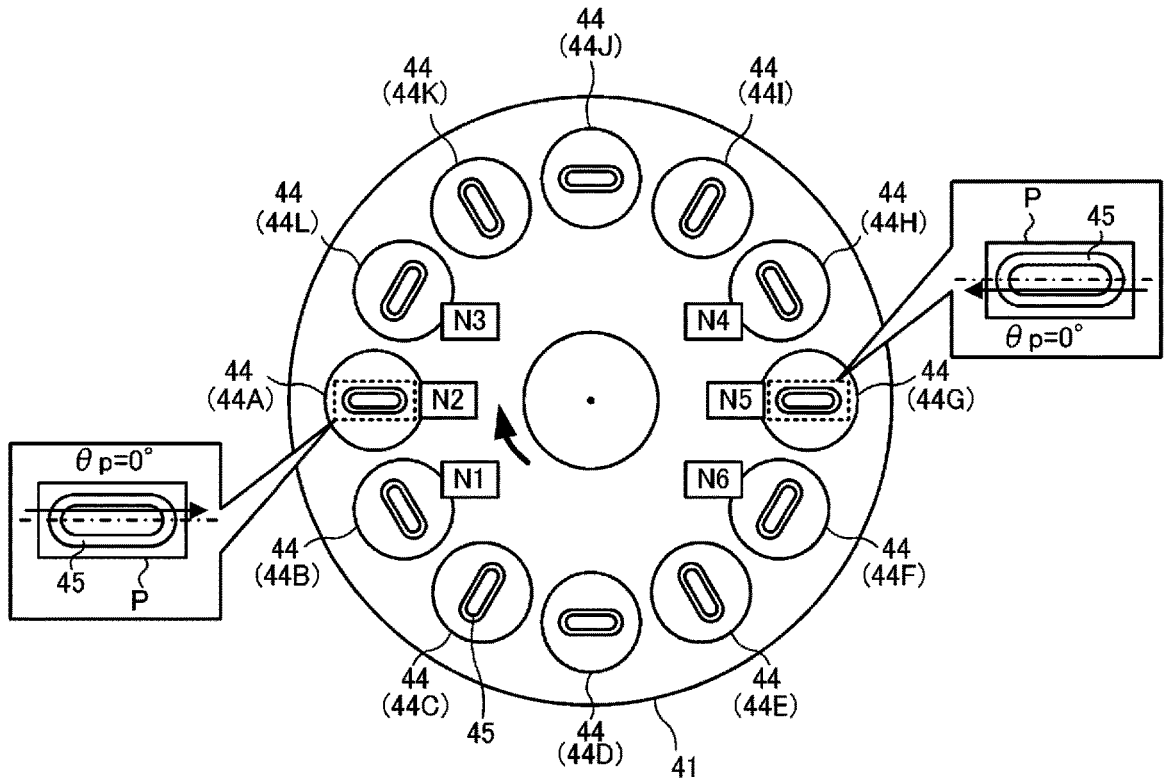
FIG. 7 is an explanatory diagram showing a state where nozzles 44A, 44G pick up component P.
Figure 8:
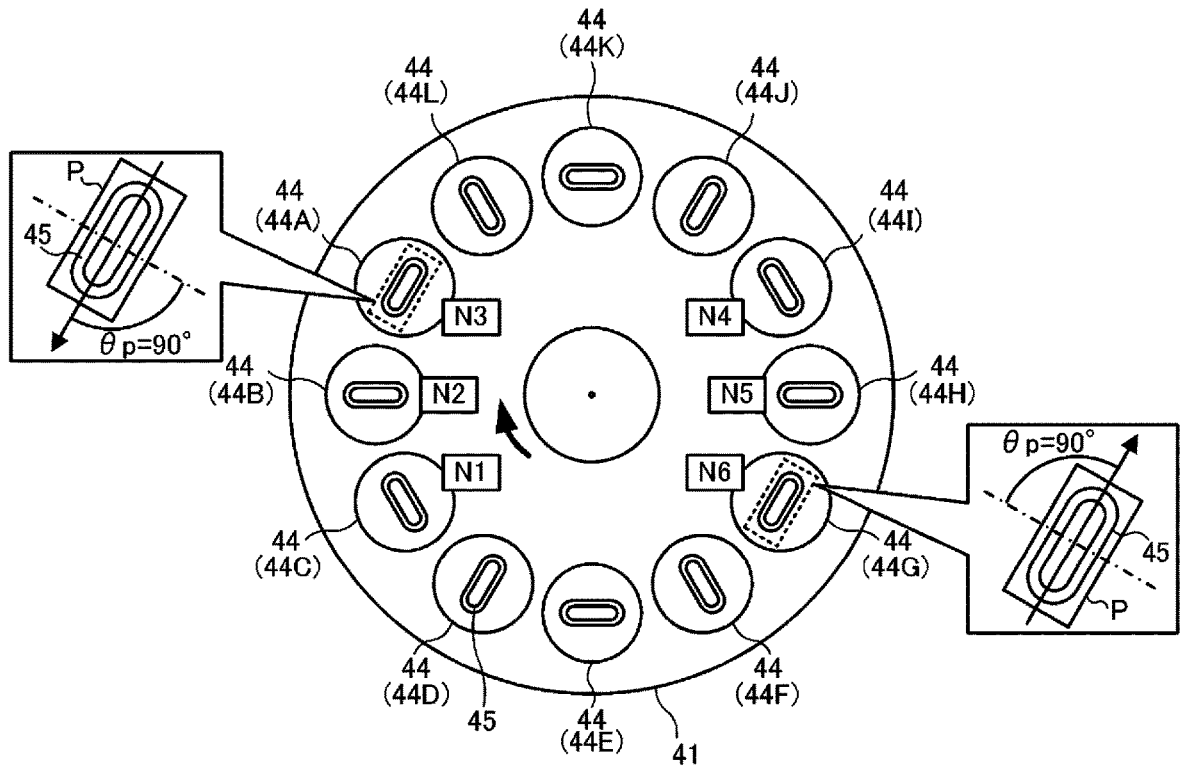
FIG. 8 is an explanatory diagram showing a state where nozzles 44A, 44G are located in component imaging positions.
Figure 9:
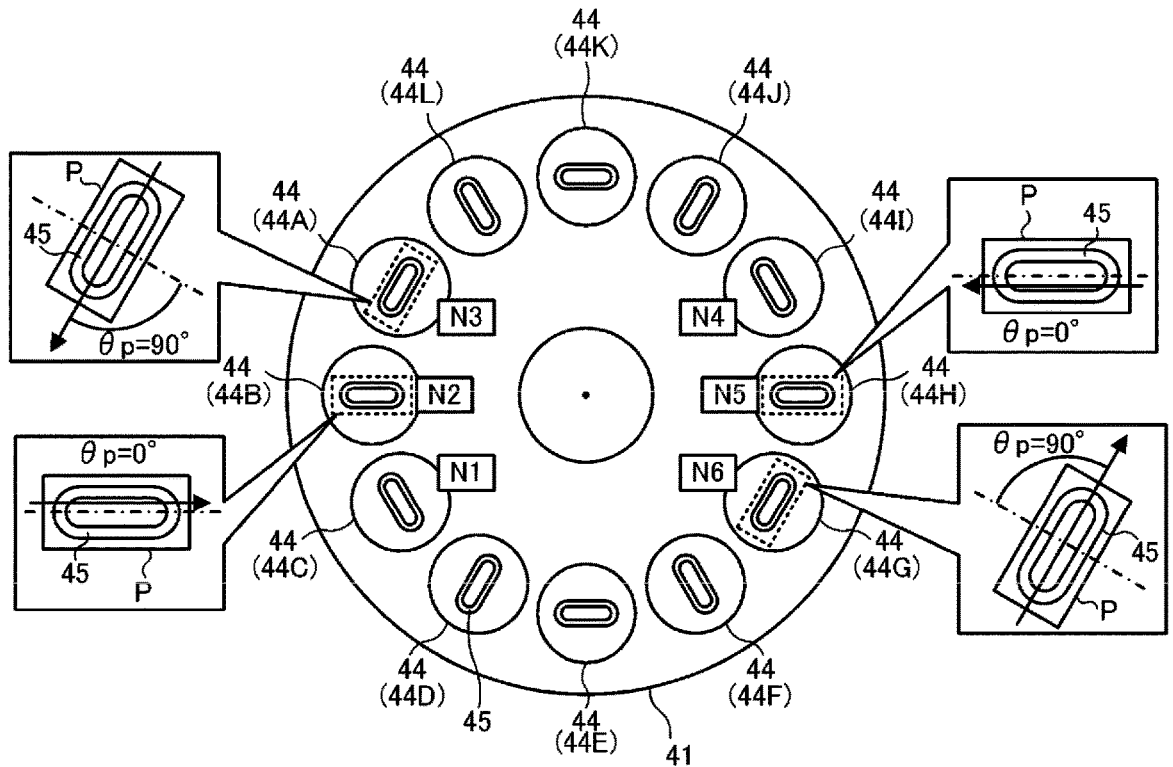
FIG. 9 is an explanatory diagram showing a state where nozzles 44B, 44H pick up component P.
Figure 10:
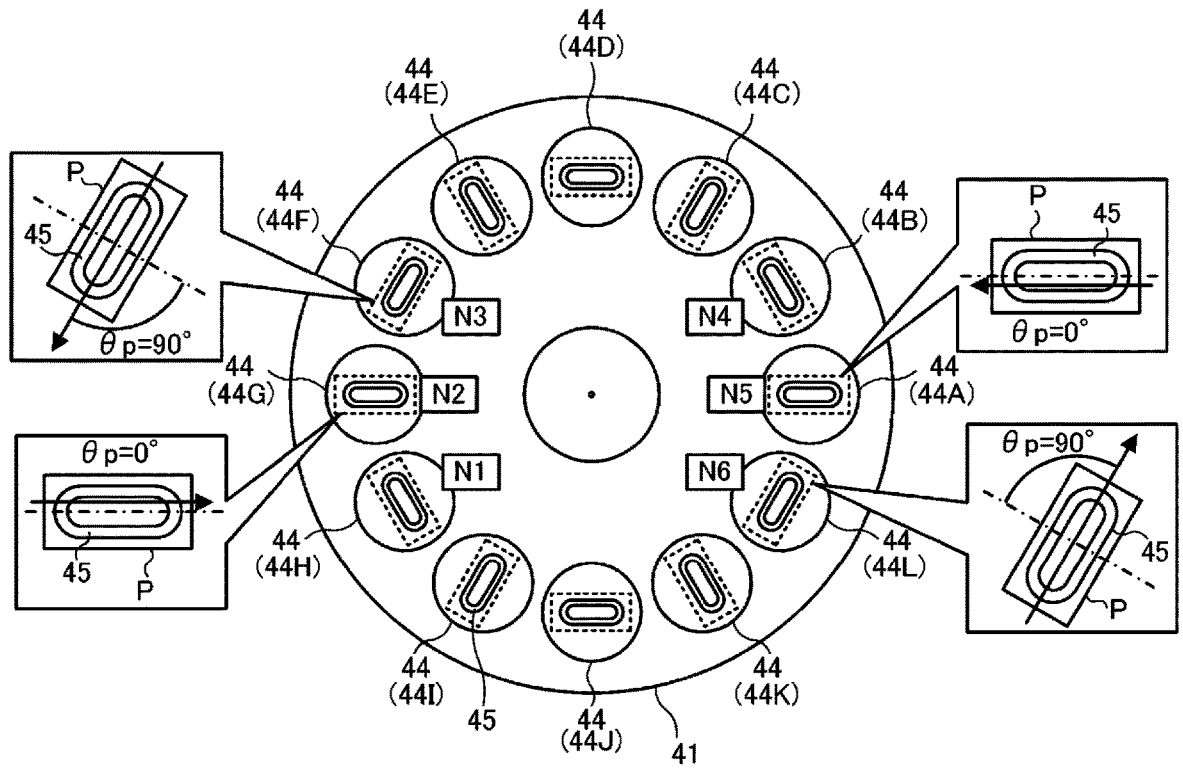
FIG. 10 is an explanatory diagram showing a state where component pickup and pickup error determinations are completed on all nozzles 44.
Figure 11:
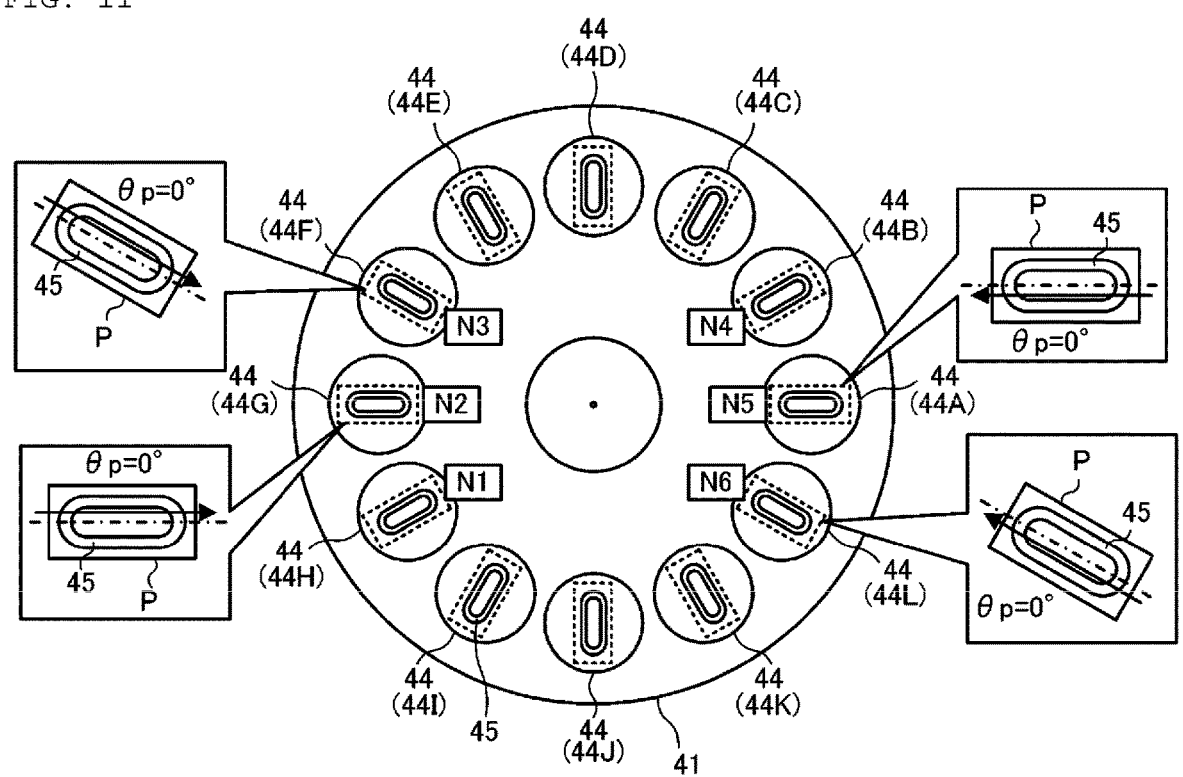
FIG. 11 is an explanatory diagram showing conditions of all nozzles 44 after nozzles 44 have picked up components in a comparison example.

Here, a component pickup related process performed by nozzles 44 will be described in detail. FIG. 5 is a flowchart showing an example of a component pickup related process routine. A program for CPU 91 to execute the routine shown in FIG. 5 is stored in, for example, HDD93. In the component pickup related process, CPU 91 causes multiple nozzles 44 to sequentially pick up components P while causing in parallel nozzles 44 to pick up components P and side camera 80 to image nozzles 44 and components P for execution of a pickup error determination. FIG. 6 is an explanatory diagram showing how nozzles 44A, 44G are positioned in component pickup positions, FIG. 7 is an explanatory diagram showing a state where nozzles 44A, 44G pick up component P, FIG. 8 is an explanatory diagram showing a state where nozzles 44A, 44G are located in component imaging positions, FIG. 9 is an explanatory diagram showing a state where nozzles 44B, 44H pick up component P, FIG. 10 is an explanatory diagram showing a state where component pickup and pickup error determinations are completed on all nozzles 44, and FIG. 11 is an explanatory diagram showing conditions of all nozzles 44 after nozzles 44 have picked up components in a comparison example. In the following description, nozzles 44A, 44G are described as being located in nozzle positions N1 and N4 as shown in FIG. 3 when the component pickup related process is started.

When starting this component pickup related process, firstly, CPU 91 moves nozzles 44 to above the component supply positions of component supply devices 20 (step S100). As shown in FIG. 3, CPU 91 causes XY robot 30 to move mounting head 40 so that nozzles 44 located in the component pickup positions (nozzle positions N2, N5) are located directly above components P located in the component supply positions. Here, components located directly below nozzle positions N2, N5 are described as being components P of the same type.

Next, CPU 91 performs a pre-pickup imaging process, a component pickup process, and a post-pickup imaging process in parallel (step S110). The pre-pickup imaging process is a process for causing side camera 80 to image states of nozzles 44 located in pre-pickup imaging positions (nozzle positions N1, N4). The component pickup process is a process for causing mounting head 40 to cause at least one of nozzles 44 located in the component pickup positions (nozzle positions N2, N5) to pick up and hold component P. In the present embodiment, CPU 91 performs the component pickup process so that all (here, two) nozzles 44 located in the component pickup positions pick up and hold component P. In the component pickup process, CPU 91 lowers nozzles 44 located in the component pickup positions, applies a negative pressure to the suction ports of end surfaces 45 of nozzles 44, causes nozzles 44 to suction pick up components P supplied to the component supply positions of component supply devices 20 at end surfaces 45, and then lifts up nozzles 44. The pre-pickup imaging process is a process for causing side camera 80 to image components P held to nozzles 44 located in the component imaging positions (nozzle positions N3, N6). As described above, since side camera 80 simultaneously images nozzle positions N1, N3, N4, and N6, side camera 80 simultaneously performs the pre-pickup imaging process and the post-pickup imaging process in one shot or one imaging process. Additionally, CPU 91 stores the captured image data in HDD 93.

CPU 91 causes the component pickup process to be performed on nozzles 44 after the pre-pickup imaging process has been performed thereon, and causes the post-pickup imaging process on nozzles 44 after the component pickup process has been performed thereon. As a result, CPU 91 performs only the pre-pickup imaging process in step S110 that is executed for the first time after the component pickup related process routine is started. For example, in the state shown in FIG. 3, CPU 91 performs only the pre-pickup imaging process on nozzles 44A, 44 G. Although once the pre-pickup imaging process is performed, the post-pickup imaging process is also performed thereafter, CPU 91 need only store, for example, only the images of the pre-pickup imaging positions in the captured image data in HDD 93.

Next, CPU 91 performs a pickup error determination process for determining on the presence or absence of an abnormality in components P held by nozzles 44 based on the images acquired in the pre-pickup imaging process and the post-pickup imaging process (step S120). Note that, since there are no nozzles 44 on which both the pre-pickup imaging process and the post-pickup imaging process have been completed in such a state that step S110 is executed for the first time after the component pickup related process routine is started, CPU91 omits the process in step S120 here and determines that there is occurring no pickup error.

Subsequently, CPU 91 determines whether the pickup process and the pickup error determination process have been completed on all nozzles 44 (step S130), and if it determines that the relevant processes have not yet been completed, CPU 91 performs in parallel a holding body revolving process for causing R-axis driving device 50 to revolve nozzles 44 and a holding body rotating process for causing Q-axis driving device 60 to cause nozzles 44 to rotate on their axes (step S140). In the holding body revolving process, CPU 91 revolves nozzles 44 by an amount corresponding to one nozzle (a pitch corresponding to one nozzle 44). That is, in the present embodiment, nozzles 44 are revolved 30 degrees (=360 degrees/12, which is the number of nozzles) in the clockwise direction when viewed from above. Therefore, when CPU 91 performs the holding body revolving process from the state shown in FIG. 3, as shown in FIG. 6, nozzles 44A and 44G move from the pre-pickup imaging positions (nozzle positions N1 and N4) to the component pickup positions (nozzle positions N2 and N5). Additionally, nozzles 44B and 44H newly move to arrive at the pre-pickup imaging positions. In the holding body rotation process, CPU 91 causes nozzles 44 to rotate on their axes by −90° with respect to the radial direction of the revolution trajectory of nozzles 44. Here, as to the direction of rotation of nozzles 44 on their axes, when viewed from above, a clockwise direction is referred to as a positive direction. As a result, as shown in FIG. 6, all multiple nozzles 44 rotate on their axes by −90° in synchronism with one another. Due to this, nozzle angles θn of nozzles 44 A and 44 G that come to be located in the component pickup positions through the holding body revolving process of this time are changed from 90° to 0° through the holding body rotating process of this time. Further, nozzle angles θn of nozzles 44B and 44H that come to be located in the pre-pickup imaging positions through the holding body revolving process of this time are changed from 0° to 90° through the holding body rotation process of this time. The reason that the nozzles 44 are caused to rotate on their axes in this manner will be described later. In addition, CPU 91 causes nozzles 44 to rotate −90° on their axes for an odd-numbered holding body rotation process, and causes nozzles 44 to rotate 90° on their axes for an even-numbered holding body rotation process. From the viewpoint of shortening the processing time, the holding body rotation process is preferably completed sometime from the end of the component pickup process in previous step S110 to the completion of the holding body revolving process, and in the present embodiment, both the processes are completed simultaneously. Further, in the structures of R-axis driving device 50 and Q-axis driving device 60 of the present embodiment, when R-axis driving device 50 revolves nozzles 44, nozzles 44 also start rotating on their axes in association with the revolution of nozzles 44. For example, when R-axis driving device 50 revolves nozzles 44 while Q-axis motor 65 is stopped, Q-axis gear 61 does not rotate and gears 63 revolve while rotating, and the nozzles 44 rotate on their axes by a predetermined angle corresponding to a revolution angle. When R-axis driving device 50 and Q-axis driving device 60 have such structures, CPU 91 controls Q-axis driving device 60 including a rotation angle generated in accordance with the revolution angle, causing nozzles 44 to rotate −90° (or 90°) on their axes in such a state that the holding body revolving process and the holding body rotating process in step S140 are completed.

After having performed the process in step S140, CPU 91 performs the processes from step S110 on. Therefore, CPU 91 executes the process in step S110 for the second time. In step S110 performed for the second time, CPU 91 performs a pre-pickup imaging process on nozzles 44B, 44H that are located in the pre-pickup imaging positions and a component pickup process on nozzles 44A, 44G that are located in the component pickup positions. As a result, as shown in FIG. 7, nozzles 44A, 44G pick up and hold component P. Here, component holding angle θp of component P will be described. Component holding angle θp is an orientation of component P held by nozzle 44 with respect to the radial direction of the revolution trajectory of nozzles 44. In the present embodiment, a direction following the longitudinal direction of component P (directions indicated by arrows in enlarged views in FIG. 7) is defined as an orientation of component P, and an angle formed by this direction and the radial direction of the revolution trajectory is defined as component holding angle θp. In component holding angle θp, a direction turning clockwise from the radial direction of the revolution trajectory, when seen from above, is referred to as positive. As described above, component P is installed on tape 22 with the longitudinal direction following the left-right direction, and the radial direction of the revolution trajectory also follows the left-right direction at the component pickup positions, and therefore, component holding angles θp of components P held in the component pickup positions become θp. In the present embodiment, the orientation of component P is defined as the direction following the longitudinal direction, but the orientation of component P can be determined arbitrarily. In addition, in the present embodiment, since component P has the shape of 2-fold symmetry when viewed from above, for example, component holding angle θp=0° and component holding angle θp=180° are synonymous, and they do not have to be distinguished from each other.

At this time, as described above, nozzle angles θn of nozzles 44A, 44G located in the component pickup positions are 0° through the holding body rotating process performed immediately before, and the longitudinal directions of end surfaces 45 and the longitudinal directions of components P picked up by nozzles 44 in question are oriented in the same direction. As a result, nozzles 44A, 44G can hold component P more appropriately. Note that even though nozzles 44 are caused to rotate on their axes while holding component P in processes from then on, since end surface 45 and component P rotate together, a difference between nozzle angle θn and component holding angle θp does not change to remain at a constant value. Therefore, in the present embodiment, nozzle angle θn and component holding angle θp are always equal to each other in such a state that nozzles 44 hold component P.

After the process in step S110 is performed in this way for the second time, CPU 91 determines that there is occurring no pickup error in step S120 because there are no nozzles 44 on which both the pre-pickup imaging process and the post-pickup imaging process have been completed. Then, CPU 91 determines in step S130 that the component pickup process and the pickup error determination process have not yet been completed on all nozzles 44 and performs the holding body revolving process and the holding body rotating process for the second time in step S140. In the holding body revolving process performed for the second time, CPU 91 revolves nozzles 44 30 degrees as done in the revolving process performed for the first time. As a result, as shown in FIG. 8, nozzles 44A, 44G that hold component P move from the component pickup positions (nozzle positions N2, N5) to the post-pickup imaging positions (nozzle positions N3, N6). In addition, nozzles 44B, 44H newly move to arrive at the component pickup positions. That is, nozzles 44B, 44H that do not hold component P come to be located in the positions (nozzle positions N2 and N5) of nozzles 44A, 44G that pick up component P in the previous component pickup process. Then, nozzles 44C, 44I newly move to the pre-pickup imaging positions. In the holding body rotation process that is performed for the second time, CPU 91 causes nozzles 44 to rotate 90 degrees on their axes because it is the even numbered holding body rotating process. As a result, as shown in FIG. 8, component holding angles θp of nozzles 44A, 44G that are located in the component imaging positions through the holding body revolving process performed this time are changed from 0° to 90° through the holding body rotating process of this time. Nozzle angles θn of nozzles 44B, 44H that are located in the component pickup positions through the holding body revolving process of this time are changed from 90° to 0° through the holding body rotating process of this time. Nozzle angles θn of nozzles 44C and 44I that are located in the pre-pickup imaging positions through the holding body revolving process of this time are changed from 0° to 90° through the present holding body rotating process performed this time.

After having performed the process in step S140 for the second time, CPU 91 executes the process in step S110 for the third time. In step S110 performed for the third time, CPU 91 executes a pre-pickup imaging process on nozzles 44C, 44I that are located in the pre-pickup imaging positions (nozzle positions N1, N4), executes a component pickup process on nozzles 44B, 44H that are located in the component pickup positions (nozzle positions N2, N5), and executes a post-pickup imaging process on nozzles 44A, 44G that are located in the component imaging positions (nozzle positions N3, N6). As a result, as shown in FIG. 9, nozzles 44, 44H pick up component P and hold component P in question at component holding angle θp=0°.

Next, CPU91 performs a pickup error determination process in step S120. Since due to the process in step S110 having been performed for the third time, the pre-pickup imaging process and the post-pickup imaging process are both completed on nozzles 44A, 44G, CPU 91 here performs a pickup error determination process on nozzles 44A, 44G. CPU 91 determines whether there is occurring a pickup error in components P held by nozzles 44A, 44G based on image data captured in the pre-pickup imaging process (pre-pickup imaging process performed three times before) performed on nozzles 44A, 44G that are located in the pre-pickup imaging positions and images captured in the post-pickup imaging process (post-pickup imaging process performed immediately before) performed on nozzles 44A, 44G that are located in the component imaging positions (post-pickup imaging positions). For example, CPU 91 recognizes a lower end position (a position corresponding to a lower surface of component P) of a region (here, a rectangular region) of pixels where component P is projected based on a difference in value of each pixel of image data before and after between same nozzle 44 picks up component P. Then, CPU91 determines whether the recognized position stays within a permissible range based on information (for example, a thickness of component P) on the shape of component P stored in advance in HDD 93, and CPU 91 determines that there is no pickup error when it determines that the recognized position stays within the permissible range. As a result, in the case where no component P is held by nozzles 44 in the first place, or in the case where a component different in type from component P is erroneously held by nozzles 44, CPU 91 can determine that there is occurring a pickup error.

If CPU 91 determines in step S120 that there is occurring no pickup error, determining in step S130 that the component P pickup process and the pickup error determination process have not yet been completed on all nozzles 44, CPU 91 executes the processes from step S140 on. That is, CPU91 alternately and repeatedly performs the holding body revolving process and the holding body rotating process in step S140, and the pre-pickup imaging process, the component pickup process, and the post-pickup imaging process in step S110, and performs the pickup error determination process in step S120 on nozzle 44 on which the post-pickup imaging process has been performed. As a result, CPU91 performs the pre-pickup imaging process, the component pickup process, the post-pickup imaging process, and the pickup error determination process sequentially in this order on each of multiple nozzles 44, whereby CPU 91 causes each nozzle 44 to pick up and hold component P and determines whether there is occurring a pickup error thereon. Then, if it determines in step S130 that the component P pickup process and the pickup error determination process have been completely performed on all nozzles 44, CPU 91 ends this routine. In this state, as shown in FIG. 10, nozzles 44F, 44L that last pick up component P are located in the component imaging positions (nozzle positions N3, N6). As shown in FIG. 10, components P are held by multiple nozzles 44 in such a manner that component holding angles θp differ by 90 degrees between adjacent nozzles 44.

If it ends the routine by determining in step S130 in the way described above that the component P pickup process and the pickup error determination process have been completely performed on all nozzles 44, CPU 91 moves mounting head 40 to be located above part camera 28, so that components P suction held to nozzles 44 are imaged by part camera 28 Then, postures of components P are recognized based on the captured images, and components P in question are mounted on board 12 by taking the postures so recognized into consideration.

If it determines in step S120 that there is occurring a pickup error, CPU 91 performs a pickup error-occurrence counteracting process (step S150) and ends the present routine halfway. As the pickup error occurrence counteracting process, CPU 91 performs, for example, a process for notifying a management device, not shown, of information informing an occurrence of a pickup error. As the pickup error occurrence counteracting process, CPU 91 may perform a process for discarding component P held by nozzle 44 on which the pickup error is determined to be occurring to a predetermined discard position. In addition, thereafter, CPU91 may cause nozzle 44 on which the pickup error has occurred to rotate on its axis and revolve nozzle 44 in question so that nozzle 44 in question is located in the pre-pickup imaging position while being oriented at nozzle angle θn=90° and perform the pre-pickup imaging process, the component pickup process, the post-pickup imaging process, and the pickup error determination process again on nozzle 44 in question.

In the component pickup related process routine described in detail above, as a result of CPU91 performing the holding body rotating process, component holding angles θp of components P held by multiple nozzles 44 are all 0° in the component pickup positions, but relevant component holding angles θp become 90° in the component imaging positions. Due to this, component P is held by nozzle 44 in such a state that the longitudinal direction thereof is perpendicular to the imaging direction (here, a direction towards the center of the revolution trajectory of nozzles 44) of side camera 80. As a result, side camera 80 images the long side of component P in the post-pickup imaging process. On the other hand, for example, let's consider a case where CPU 91 does perform the holding body rotating process, whereby component holding angle θp is 0° at all times. In this case, as shown in FIG. 11, side camera 80 images the short side of component P in the component imaging position. In the present embodiment, since the long side of component P is imaged in the post-pickup imaging process, the length of a lower end of component P imaged in the post-pickup imaging process becomes longer when compared with a case where the short side of component P is imaged as shown in FIG. 11. Therefore, it becomes easy to recognize the lower end position of component P described in the pickup error determination process. As described above, in the present embodiment, by performing the holding body rotating process, component holding angle θp of nozzle 44 located in the component imaging position becomes an imaging angle suitable for imaging component P after it is picked up by nozzle 44 (here, 90°). The imaging angle is an example of a detection angle.

In addition, each of multiple nozzles 44 takes the same value (here, 90°) for nozzle angle θn when located in the component imaging position as when located in the pre-pickup imaging position. Therefore, even though end surface 45 has the longitudinal direction and the lateral direction, the apparent shape of nozzle 44 becomes the same in image data before and after component P is picked up. Therefore, CPU 91 can more easily recognize component P in the pickup error determination process.

Here, the correspondence relationship between the constituent elements of the present embodiment and constituent elements of the present disclosure will be clarified. Head main body 41 of the present embodiment corresponds to a rotating body of the present disclosure, nozzle 44 corresponds to a holding body, mounting head 40 corresponds to a mounting head, R-axis driving device 50 corresponds to a revolving mechanism, Q-axis driving device 60 corresponds to a rotating mechanism, side camera 80 corresponds to a detection section, and control device 90 corresponds to a control section.

In component mounter 10 that has been described in detail heretofore, in performing the holder revolving process, CPU 91 performs the holding body rotating process for causing multiple nozzles 44 to rotate on their axes so that component holding angle θp of component P held by nozzle 44 located in the component imaging position (nozzle positions N3, N 6) through the holding body rotating process of this time becomes the imaging angle (=90°) that is different from component holding angle θp (=0°) at which component P is picked up. Therefore, component P picked by nozzle 44 in the component pickup position (nozzle positions N2, N5) moves with nozzle 44 revolving and rotating on its axis through the holding body revolving process and the holding body rotating process, respectively and eventually arrives at the component imaging position (nozzle positions N3, N6) while its orientation is adjusted in such a manner that component holding angle θp becomes the imaging angle (=90°). Due to this, in case the imaging angle is determined in advance so as to be an angle suitable for imaging component P, held component P can be imaged more appropriately by side camera 80. In the present embodiment, when component holding angle θp is 90°, since side camera 80 can image the long side of component P, the lower end position of component P can be recognized with good accuracy. Therefore, the imaging angle constitutes the angle suitable for imaging component P.

In addition, CPU 91 alternately and repeatedly performs the component pickup process for causing mounting head 40 to cause two or more (here, two) nozzles 44 that are located in the component pickup positions to pick up and hold component P and the holding body revolving process for causing R-axis driving device 50 to locate nozzles 44 that hold no component P individually in the positions (nozzle positions N2, N5) where components P have been picked up before. As a result, CPU 91 causes two or more nozzles 44 (here, two nozzles) to hold component P through one component pickup process and causes multiple (here, 12) nozzles 44 to sequentially hold component P. Then, in the holding body revolving process, CPU 91 performs the holding body revolving process for controlling Q-axis driving device 60 so that component holding angle θp of each of components P held by two or more (here, two) nozzles 44 that are positioned in the component imaging positions through the holding body revolving process of this time becomes the imaging angle (=90°) that is different from component holding angle θp (=0°) of each of components P at which component P is picked up. Due to this, even in the case where two or more (here, two) nozzles 44 are caused to pick up component P through one component pickup process, the orientations of components P so picked up can be adjusted so that component holding angle θp of each of picked up components P constitutes the imaging angle when nozzles 44 so picked up are located in the component imaging positions.

Further, each of multiple nozzles 44 has the shape in which end surface 45 has the longitudinal direction and the lateral direction. Then, the orientations of multiple nozzles 44 are determined so that the difference between nozzle angle θn of nozzle 44 located in the component pickup position and nozzle angle θn of nozzle 44 located in the component imaging position is equal to the difference (=90°) between component holding angle θp (=0°) at which component P is picked up and the imaging angle (=90°) even with any nozzle 44 of multiple nozzles 44 located in the component pickup position. As a result, with the orientation of nozzle 44 to component P when picking up component P in question held in the appropriate state, component holding angle θp of component P picked up can be adjusted to the imaging angle (=90°) in the component imaging position. Therefore, component P can be picked up by nozzle 44 that is oriented appropriately, and component P in question can be imaged more appropriately. For example, let's consider a case where the component pickup related process routine described above is performed when multiple nozzles 44 are attached in such a manner that all the orientations of multiple nozzles 44 become the same nozzle angle θn. In this case, although component holding angle θp can be 0° in the component pickup position and 90° in the component imaging position, half nozzles 44 of the 12 nozzles 44 pick up and hold component P with nozzle angle θn and component holding angle θp shifted by 90° from each other. That is, component P is held in such a state that the longitudinal direction of end surface 45 and the longitudinal direction of component P are orthogonal to each other. In the present embodiment, nozzle 44 can pick up component P more appropriately than in the case described above.

Furthermore, the difference between component holding angle θp and imaging angle at the time of picking up component P is 90°. When component holding angle θp at which component P is picked up and the component holding angle suitable for imaging differ by 90°, for example, in case component holding angle θp is the same at the time of picking up as at the time of imaging, it easily becomes difficult for component P to be imaged appropriately. Due to this, in such a case, it is highly significant that by performing the holding body rotating process, component P is given an imaging angle at which component holding angle θp becomes different from one resulting when component P is picked up when component P is located in the component imaging position.

The present disclosure is not limited in any way to the embodiment described heretofore, and needless to say, the present disclosure can be carried out in various forms without departing from the technical scope. For example, in the embodiment described above, multiple nozzles 44 have end surface 45 having the longitudinal direction and the lateral direction, but the present disclosure is not limited thereto. For example, an outer diameter of end surface 45 when viewed from a lower surface side may be circular. When end surface 45 does not have the longitudinal direction and the lateral direction, nozzle angle θn does not have to be equal to the difference between component holding angle θp at which component P is picked up and the imaging angle.

In the embodiment described above, the difference between component holding angle θp and the imaging angle is 90°, but the present disclosure is not limited thereto. For example, in the embodiment described above, when the difference between component holding angle θp and the imaging angle is 60°, CPU 91 may cause nozzles 44 to rotate on their axes by −60° in the odd-numbered holding body rotating processes rotation while causing nozzles 44 to rotate on their axes by 60° in the even-numbered holding body rotating processes. Alternatively, CPU 91 may cause nozzles 44 to rotate on their axes by 60° every time CPU 91 performs the holding body rotating process.

In the embodiment described above, the component imaging position is the position of the nozzle 44 located adjacent to nozzle 44 located in the component pickup position, but the present disclosure is not limited thereto. For example, in case the difference between component holding angle θp and the imaging angle is 90 degrees when the component imaging position is located two nozzles 44 away from nozzle 44 located in the component pickup position, CPU91 need only cause nozzles 44 to rotate on their axes by 45 degrees in the holding body rotating process.

In the embodiment described above, 12 nozzles 44 are arranged circumferentially at equal intervals, but the number of nozzles 44 is not limited to 12, and hence, the number of nozzles 44 may be, for example, 8, 20, 24, or the like. The number of nozzles 44 may be an even number or an odd number.

In the embodiment described above, the component pickup process is performed at both of the two component pickup positions, but the present disclosure is not limited thereto. The component pickup process need only be performed in at least one of the component pickup positions existing on the revolution trajectory of nozzles 44. In addition, the number of component pickup positions existing on the revolution trajectory nozzles 44 is not limited to two, and hence, the number of component pickup positions may be one or three or more (for example, four).

In the embodiment described above, CPU 91 causes nozzles 44 to rotate on their axes by −90° in then odd-numbered holding body rotating processes and causes nozzles 44 to rotate on their axes by 90° in the even-numbered holding body rotating processes, but the present disclosure is not limited thereto, and hence, CPU 91 may cause nozzles 44 to rotate on their axes by 90° every time it performs the holding body rotating process, for example. When it is unnecessary to distinguish component holding angles θp that differ 180 degrees from each other due to, for example, component P having the 2-fold symmetric shape when viewed from the upper surface side thereof as in the embodiment described above, component P may be caused to rotate on its axis by 90 degrees every time. However, since the orientations of components P in the component imaging positions can be made completely the same, it is preferable to cause components P to rotate on their axes in the same manner as in the present embodiment.

In the embodiment described above, the imaging angle is set at 90°, but the imaging angle may be any angle suitable for imaging component P. For example, there may be a case where component P is held inclined to nozzle 44 when component P is picked up, and this inclined state is desired to be determined through the pickup error determination process from time to time. In such a case, since component P tends to be inclined in such a manner that the short side is inclined on many occasions, it is easier to determine the presence or absence of such an inclination based on an image by imaging the short side of component P while imaging component P along the longitudinal direction thereof. In such a case, the imaging angle is preferably 0°. Then, in the case where component P is nevertheless installed on tape 22 in such a manner that the lateral direction of component P follows the lateral direction, component holding angle θp when component P is picked up becomes 90°. Even in such cases, by CPU 91 performing the holding body rotating process in the same manner as in the embodiment described above, even though component holding angle θp when component P is picked up is 90°, component holding angle θp in the component imaging position can be set at the imaging angle (=0°). As another example, there may be a case where component P has leads that project to both sides from a main body portion thereof. In this case, when it is desired to image the projecting leads, it is preferable that side camera 80 images the leads from a direction perpendicular to the direction in which the leads project. In such a case, with an orientation of component P in which the direction in which the leads of component P project becomes perpendicular to the radial direction of the revolution trajectory of nozzles 44 referred to as an imaging angle, the rotating angle in the holding body rotating process need only be determined so that component holding angle θp in the component imaging position becomes this imaging angle.

In the embodiment described above, side camera 80 performs imaging before and after component P is picked up, but side camera 80 need only perform imaging in at least the component imaging position (the post-pickup imaging position in the embodiment described above). In addition, side camera 80 is described as being a device configured to perform imaging in a direction toward the center of the revolution trajectory of nozzles 44, but the present disclosure is not limited thereto. For example, side camera 80 may image nozzle position N3 from the left (a direction forming an angle of 30 degrees with the radial direction of the revolution trajectory) in the figure. In this case, in case component holding angle θp, that is the imaging angle in nozzle position N3 is 60°, side camera 80 can image component P from the direction perpendicular to the longitudinal direction of component P, as in the present embodiment. Additionally, side camera 80 is configured to simultaneously image nozzle positions N1, N3, N4, and N6, but the present disclosure is not limited thereto, and hence, a side camera may be provided for each nozzle position.

In the embodiment described above, CPU 91 may perform a pre-pickup error determination process for confirming that component P is not held by nozzle 44 based on an image captured in the pre-pickup imaging process. For example, before and after step S120, CPU 91 may determine whether component P is held by nozzle 44 located in the pre-pickup imaging position (nozzle positions N1 and N4) based on the image obtained in the pre-pickup imaging process in step S110 performed immediately before. This determination may be performed, for example, in such a manner that CPU 91 recognizes the region of nozzle 44 in the image obtained and determines whether a region recognized as component P exists below the region of nozzle 44 that is recognized by CPU 91. When it determines from the pre-pickup error determination process that there is occurring an error (nozzle 44 holds component P), CPU 91 may, for example, notify a management device, not shown, of information informing that a pre-pickup error is occurring or may perform a discarding process for discarding component P held by nozzle 44 on which the pre-pickup error is determined to be occurring to a predetermined discard position.

In the embodiment described above, components P picked up in nozzle positions N2, N5 are described as being of the same type, but components P of different types may be picked up there, or components P may be installed on tape 22 in different orientations.

In the embodiment described above, mounting head 40 includes nozzles 44 configured to pick up component P by making use of the negative pressure, but the present disclosure is not limited thereto, and hence, mounting head 40 need only include not only nozzles 44 but also holding bodies configured to hold a component. For example, mounting head 40 may include mechanical chucks configured to grip and hold component P instead of nozzles 44.

In the embodiment described above, component mounter 10 includes side camera 80 as an imaging section, and this side camera 80 images components P held by nozzles 44 located in the component imaging positions from the side thereof. However, in addition to or in place of the imaging section configured to perform imaging, component mounter 10 need only include a detection section configured to detect component P held by nozzle 44 from the side thereof. In this case, the pre-pickup imaging position described above may be referred to as a pre-pickup detection position, the post-pickup imaging position may be referred to as a post-pickup detection position, the component imaging position may be referred to as a component detection position, and the imaging angle may be referred to as a detection angle. The detection section may detect component P held by nozzle 44 positioned in the detection position from the side thereof, for example, by shining light from a laser or an LED from the side. The detection section may detect nozzle 44 located in the pre-pickup detection position from the side thereof, or may detect the presence or absence of component P in a region where nozzle 44 located in the pre-pickup detection position holds component P (for example, a region below nozzle 44) from the side.

The component mounter of the present disclosure may be configured as follows.

In the component mounter of the present disclosure, the component pickup position and the component detection position each exist multiple, and the control section alternately and repeatedly performs the component pickup processing for causing the mounting head to cause two or more the holding bodies located in the component pickup positions to pick up and hold the component and the holding body revolving processing for causing the revolving mechanism to locate the holding body that does not hold the component in each of the positions of the two or more the holding bodies that pick up the component during the component pickup processing, and in executing the holding body revolving processing, the control section performs the holding body rotating processing for causing the rotating mechanism to change the component holding angle of each of the components held to the two or more the holding bodies located in the component detection positions through a current holding body revolving processing to the detection angle that differs from the component holding angle of the component when each of the components is picked up. In this way, even in the case where each of the two or more the holding bodies is caused to pick up a component through one component pickup operation, the orientations of the held components can be adjusted so that the component holding angle of each of the picked up components becomes the detection angle in the component detection position.

In the component mounter of the present disclosure, each of the multiple holding bodies is a nozzle in which an end surface configured to come into contact with the component when holding the component has a shape having a longitudinal direction and a lateral direction, and the multiple holding bodies are such that individual orientations of the multiple holding bodies are determined so that with an orientation of the end surface based on a radial direction of the revolution trajectory referred to as a nozzle angle, a difference between the nozzle angle of the holding body located in the component pickup position and the nozzle angle of the holding body located in the component detection position is equal to a difference between the component holding angle when the component is picked up and the detection angle even with any holding body of the multiple holding bodies located in the component pickup position. As a result, the component holding angle of the picked up component can be adjusted to the detection angle in the component detection position while the orientation of the nozzle to a component to be picked up is kept in an appropriate state. Therefore, the component can be picked up with the nozzle oriented in the appropriate direction, and the component can be detected more appropriately.

In the component mounter of the present disclosure, the difference between the component holding angle when the component is picked up and the detection angle may be 90°. When the component holding angle when the component is picked up and the component holding angle suitable for detection differ by 90°, for example, in case the component holding angle is the same when the component is picked up as when the component is detected, it easily becomes difficult for the component to be detected properly. Due to this, in such a case, it is highly significant that by performing the holding body rotating process, the component is given a detection angle at which the component holding angle becomes different in the component detection position from one resulting when the component is picked up.

In the component mounter of the present disclosure, the component detection position may be a position of the holding body located adjacent to the holding body located in the component pickup position.

In the component mounter of the present disclosure, the detection section may be an imaging section configured to image a component held by the holding body located in one or more the component detection positions from a side thereof.

INDUSTRIAL APPLICABILITY

The present disclosure can be applied to various industries where components are mounted on boards.

REFERENCE SIGNS LIST

10 Component Mounting Machine, 12 Board, 20 Component Supply Device, 21 Reel, 22 Tape, 25 Board Conveyance Device, 26 Conveyor Belt, 27 Support Pin, 28 Part Camera, 29 Mark Camera, 30 XY Robot, 31 X-Axis Guide Rail, 32 X-Axis Slider, 33 Y-Axis Guide Rail, 34 Y-Axis Slider, 36 X-Axis Motor, 38 Y-Axis Motor, 40 Head, 41 Head Main Body, 41a Reflective Body, 42 Nozzle Holder, 42a Engagement Piece, 44, 44 A to 44 L Nozzle, 45 End Surface, 46 Pressure Adjustment Valve, 50 R-Axis Driving Device, 51 R Shaft, 52 R-Axis Gear, 53 Gear, 54 R-Axis Motor, 55 R-Axis Position Sensor, 60 Q-Axis Driving Device, 61 Q-Axis Gear, 62 Q-Axis Gear, 63, 64 Gear, 65 G-Axis Motor, 66 Q-Axis Position Sensor, 70 Z-Axis Driving Device, 71 Z-axis slider, 71a Gripping Section, 72 Ball Screw, 73 Z-Axis Motor, 74 Z-Axis Position Sensor, 80 Side Camera, 82 Camera Main Body, 84 Housing, 86a to 86d First to Fourth Entrance ports, 87 Illuminant, 88a to 88k Mirrors, 90 Control Device, 91 CPU, 92 ROM, 93 HDD, 94 RAM, 95 input/output interface, 96 Bus, N1 to N6 Nozzle Positions, P Component.

[FIG. 1]
UP; DOWN; LEFT; RIGHT; FRONT; REAR; X-Axis; Y-Axis
[FIG. 2]
UP; DOWN; LEFT; RIGHT; X-Axis; Y-Axis
[FIG. 3]
REAR; FRONT; LEFT; RIGHT; X-Axis; Y-Axis
[FIG. 4]
95 INPUT/OUTPUT I/F; 20 COMPONENT SUPPLY DEVICE; 25 BOARD CONVEYANCE DEVICE; 30 XY ROBOT; 36 X-Axis MOTOR; 38 Y-Axis MOTOR; 40 MOUNTING HEAD; 54 R-Axis MOTOR; 65 Q-Axis MOTOR; 73, 73 Z-Axis MOTOR; 55 R-Axis POSITION SENSOR; 66 Q-Axis POSITION SENSOR; 74, 74 Z-Axis POSITION SENSOR; 46 PRESSURE ADJUSTMENT VALVE; 28 PART CAMERA; 29 MARK CAMERA; 80 SIDE CAMERA
[FIG. 5]
COMPONENT PICKUP RELATED PROCESS ROUTINE;
S100 MOVE NOZZLE TO ABOVE COMPONENT SUPPLY POSITION;
S110 PRE-PICKUP IMAGING PROCESS; COMPONENT PICKUP PROCESS; POST-PICKUP IMAGING PROCESS
S120 PICKUP ERROR DETERMINATION; ERROR EXISTS; NO ERROR EXISTS;
S130 HAVE PICKUP AND ERROR DETERMINATIONS BEEN PERFORMED ON ALL NOZZLES?;
S140 HOLDING BODY REVOLVING PROCESS; HOLDING BODY ROTATING PROCESS;
S150 PICKUP ERROR OCCURRENCE COUNTERACTING PROCESS

The invention claimed is:

1. A component mounter comprising:
   multiple component supply devices aligned side by side in a horizontal direction and configured as tape feeders that respectively feed out tapes with components disposed at predetermined intervals at a predetermined pitch,
   a mounting head which has a rotating body and multiple holding bodies arranged along a circumferential direction of the rotating body and is configured to hold a component from a component supply device of the multiple component supply devices, the multiple holding bodies revolving along a revolution trajectory caused by rotation of the rotating body, a first component pickup position and a second component pickup position, where the holding bodies pick up a component, residing on the revolution trajectory at opposite positions through a center axis of the rotating body;
   a revolving mechanism connected to R-axis driving motor and a shaft configured to revolve the multiple holding bodies by rotating the rotating body around the center axis;
   a rotating mechanism configured to cause the multiple holding bodies to rotate respectively in synchronism with each other;
   a detection section including a camera configured to detect a component from a side thereof, the component being held by the holding body that is located in a component detection position which is different from the first and the second component pickup positions on the revolution trajectory, and
   a control section configured to
   perform component pickup processing and holding body revolving processing alternately and repeatedly, the component pickup processing causing the mounting head to enable the holding bodies, being located in the first and second component pickup position, to pick up and hold the component, the holding body revolving processing causing the revolving mechanism to locate, in the first component pickup position, a holding body not holding the component, and
   execute holding body rotating processing, which causes the rotating mechanism to change a component holding angle of a held component to a detection angle that differs from the component holding angle of the held component when the held component is picked up at each of the first and second component pickup positions, the held component being held to at least one of the holding bodies located in the component detection position, the component holding angle representing an orientation of the component based on a radial direction of the revolution trajectory.

2. The component mounter according to claim 1,
   wherein the first and second component pickup positions are two of multiple component pickup positions on the revolution trajectory and the component detection position is one of multiple component detection positions on the revolution trajectory, and
   wherein the control section alternately and repeatedly performs the component pickup processing for causing the mounting head to cause two or more of the holding bodies located in the component pickup positions to pick up and hold the component and the holding body revolving processing for causing the revolving mechanism to locate the holding body that does not hold the component in each of the positions of the two or more the holding bodies that pick up the component during the component pickup processing, and in executing the holding body revolving processing, the control section performs the holding body rotating processing for causing the rotating mechanism to change the component holding angle of each of the components held to the two or more the holding bodies located in the component detection positions through a current holding body revolving processing to the detection angle that differs from the component holding angle of the component when each of the components is picked up.

3. The component mounter according to claim 1,
   wherein each of the multiple holding bodies is a nozzle in which an end surface configured to come into contact with the component when holding the component has a shape having a longitudinal direction and a lateral direction, and
   wherein the multiple holding bodies are such that individual orientations of the multiple holding bodies are determined so that with an orientation of the end surface based on a radial direction of the revolution trajectory referred to as a nozzle angle, a difference between the nozzle angle of the holding body located in the first component pickup position and the nozzle angle of the holding body located in the component detection position is equal to a difference between the component holding angle when the component is picked up and the detection angle even with any holding body of the multiple holding bodies located in the first component pickup position.

4. The component mounter according to claim 1,
   wherein a difference between the component holding angle when the component is picked up and the detection angle is 90°.

5. The component mounter according to claim 1,
   wherein the component detection position is a position of the holding body located adjacent to the holding body located in the component pickup position.

6. The component mounter according to claim 1,
   wherein the component detection position is one of multiple component detection positions on the revolution trajectory, the multiple component detection positions including positions immediately before and after each of the first and second component pickup positions on the revolution trajectory.

7. The component mounter according to claim 1, further comprising:
   an XY robot connected to X and Y guide rails, configured to move the mounting head along X and Y axes; and
   a board conveyance device connected to a pair of conveyor belts, configured to move a board on which the components are mounted, wherein
   the detection section includes a camera provided between the component supply devices and the board conveyance device.

* * * * *